United States Patent
Hsu et al.

(10) Patent No.: US 9,419,033 B2
(45) Date of Patent: Aug. 16, 2016

(54) CHIP SCALE PACKAGE OF IMAGE SENSOR HAVING DAM COMBINATION

(71) Applicant: POWERTECH TECHNOLOGY INC., Hsinchu (TW)

(72) Inventors: Shou-Chian Hsu, Hsinchu (TW); Wei-Chun Chao, Hsinchu (TW)

(73) Assignee: POWERTECH TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/523,149

(22) Filed: Oct. 24, 2014

(65) Prior Publication Data

US 2016/0118427 A1      Apr. 28, 2016

(51) Int. Cl.
*H01L 27/146* (2006.01)

(52) U.S. Cl.
CPC .... *H01L 27/14618* (2013.01); *H01L 27/14636* (2013.01)

(58) Field of Classification Search
None
See application file for complete search history.

(56) References Cited

U.S. PATENT DOCUMENTS

| 7,005,720 B2 | 2/2006 | Huang et al. | |
| 2004/0189855 A1* | 9/2004 | Takasaki | H01L 27/146 348/340 |
| 2012/0307139 A1* | 12/2012 | Cheng | G02B 7/02 348/374 |

* cited by examiner

*Primary Examiner* — Charles Garber
*Assistant Examiner* — Brigitte Paterson
(74) *Attorney, Agent, or Firm* — Muncy, Geissler, Olds & Lowe, P.C.

(57) ABSTRACT

Disclosed is a chip scale package of image sensor having a dam combination, comprising an image sensor chip, a dam combination, a transparent lid disposed on the dam combination, and a plurality of external terminals disposed on the backside of the chip. An image sensing area is formed on the active surface of the image sensor chip. A dam combination consists essentially of at least two dam parts and has an image sensing window. The peripheries of the image sensor window are formed by a pre-formed dam part and are adjacent to the image sensing area with horizontal spacing not greater than 200 μm. There is a combination interface between the two dam parts. The combination interface and the post-formed dam part are far away from the image sensing area than the pre-formed dam part to keep residues caused by the disposition of the pre-formed dam part to be away from the 200 μm exclusive region around the image sensing area.

8 Claims, 5 Drawing Sheets

CHIP SCALE PACKAGE OF IMAGE SENSOR HAVING DAM COMBINATION

FIELD OF THE INVENTION

The present invention relates to a semiconductor image sensor package and more specifically to a chip scale package of image sensor having dam combination for the implementation of microminiaturized image sensors for portable electronics.

BACKGROUND OF THE INVENTION

For conventional image sensor packages, substrates are implemented as carriers for image sensor chips as revealed in U.S. Pat. No. 7,005,720 taught by Huang etc. An image sensor chip is disposed on a substrate and is electrically connected to the substrate by a plurality of bonding wires. Dam is disposed on the peripheries of the substrate and a transparent lid is disposed on the dam so that the image sensor chip is airtight sealed inside the space formed by the substrate, the lid, and the dam. Therefore, a conventional substrate footprint is at least four times larger than the image sensor chip. However, as the requirements of smart phones or portable devices for light, thin, small with more functions, the image sensor packages need further microminiaturization.

As the development of image sensor package moving toward chip scale packages, the formation and location of dam become crucial for better product reliability. If the dam is formed on a CMOS chip by printing, the location tolerance of the dam is too large where the image sensing area of an image sensor chip is easily contaminated during dam formation processes. Moreover, too large or too small opening of the image sensing window formed by the dam may cause product defeats. When the image sensing window is a large opening, the transparent lid is easily come off due to less adhesive area between the dam and the transparent lid. On the other hand, when the image sensing window is a small opening, residues of the dam during formation processes is disposed on the corners and peripheries of the image sensing window leading to poor sensing performance. Moreover, for a dam with more than 40 μm thickness, the current bottleneck for the horizontal spacing from the peripheries of the image sensing window to the image sensing area of an image sensing chip has to be greater than 200 μm to achieve better CSP package reliability where image sensor chips cannot further be reduced and microminiaturized.

SUMMARY OF THE INVENTION

The main purpose of the present invention is to provide a chip scale package of image sensor having dam combination to further shrink the central opening of the dam combination to further closer to the image sensing area without photoresist residues of the dam combination and to provide enough adhesive area to hold the transparent lid on top of the dam combination to achieve microminiaturization of chip scale image sensor packages.

According to the present invention, a chip scale package of image sensor having dam combination is revealed comprising an image sensor chip, a dam combination, a transparent lid, and a plurality of external terminals. The image sensor chip has an active surface and an opposing back surface where an image sensing area and a plurality of electrodes are disposed on the active surface. The dam combination consists essentially of a first dam part and a second dam part and has an image sensing window to expose the image sensing area of the image sensor chip within where the first dam part and the second dam part are disposed on the active surface. The peripheries of the image sensing window are defined by the internal edges of the first dam part where horizontal spacing from the internal edges of the first dam part (the peripheries of the image sensing window) to the image sensing area is not greater than 200 μm. There is a combination interface between the first dam part and the second dam part where the combination interface and the second dam part are far away from the image sensing area corresponding to the internal edges of the first dam part. The transparent lid is disposed on the dam combination to airtight seal the image sensing window. The external terminals are disposed on the back surface of the image sensor chip and are electrically connected to the electrodes where the locations of the external terminals are within the footprint of the image sensor chip.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
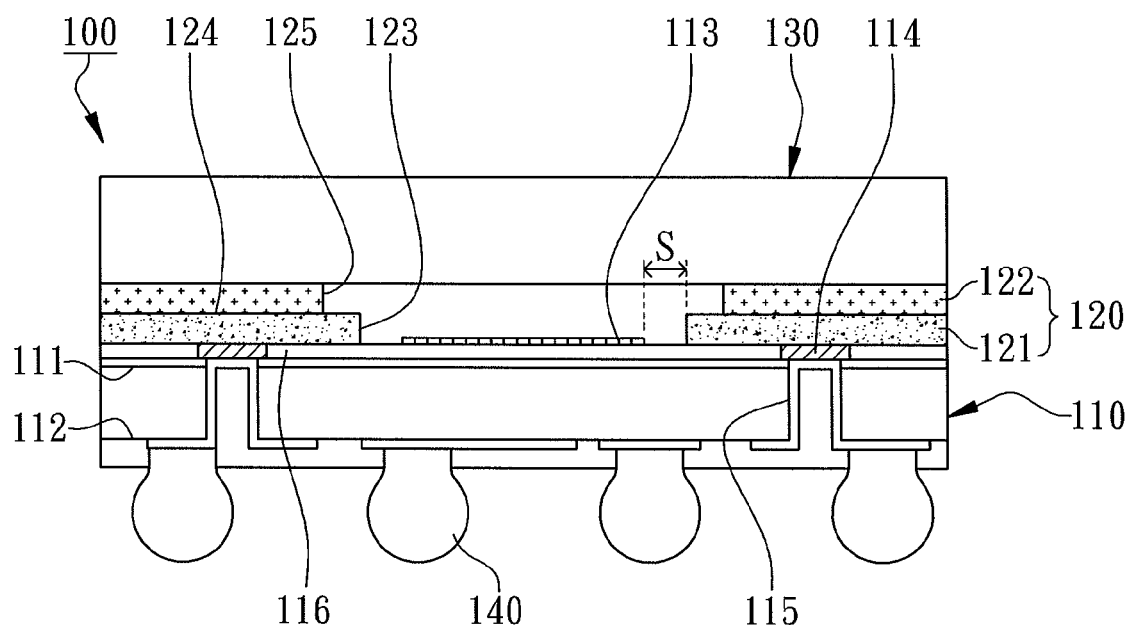
FIG. 1 is a cross-sectional view illustrating a chip scale package of image sensor having dam combination according to the first embodiment of the present invention.

According to the first embodiment of the present invention, a chip scale package of image sensor having dam combination is disclosed and illustrated in FIG. 1 for a cross-sectional view and from FIGS. 2A to 2E for cross-sectional views during its packaging processes. The chip scale package 100 comprises an image sensor chip 110, a dam combination 120, a transparent lid 130, and a plurality of external terminals 140.

The image sensor chip 110 is a CMOS image sensor chip where the image sensor chip 110 has an active surface 111 and an opposing back surface 112. An image sensing area 113 and a plurality of electrodes 114, and the corresponding IC circuitry are disposed on the active surface 111. The electrodes 114 are contact pads to allow the power and the ground to be transmitted to the image sensing area 113 and image data are transmitted from the image sensing area 113. Normally, the image sensor chip 110 is made of semiconductor materials such as Si (silicon).

The dam combination 120 consists essentially of a first dam part 121 and a second dam part 122 where the dam combination 120 has an image sensing window 123 to expose the image sensing area 113 of the image sensor chip 110 within. The first dam part 121 and the second dam part 122 are disposed on the active surface 111 wherein the first dam part 121 is adhered to the passivation layer 116 on the active surface 111. The second dam part 122 is stacked on the first dam part 121 or is adhered to the passivation layer 116. The combination thickness of the first dam part 121 and the second dam part 122 should be greater than 40 μm where 44 μm is achieved in the present embodiment. The first dam part 121 and the second dam part 122 are made of electrical isolation materials, especially including photo-sensitive polymer or organic resin or photo-sensitive resin. The image sensing window 123 is a closed opening to completely expose the image sensing area 113 of the image sensor chip 110 within. Furthermore, the peripheries of the image sensing window 123 is defined by the internal edges of the first dam part 121 where a horizontal spacing S from the peripheries of the image sensing window 123 to the image sensing area 113 is not greater than 200 μm. The first dam part 121 is pre-formed and the second dam part 122 is post-formed, i.e., the formation processes of the first dam part 121 on the image sensor chip 110 is performed before the formation processes of the second dam part 122 on the image sensor chip 110, therefore, a combination interface 124 is formed between the first dam part 121 and the second dam part 122. Corresponding to the active surface 111, the combination interface 124 can be horizontal or vertical. In the present embodiment, the combination interface 124 is horizontal. Moreover, the combination interface 124 and the second dam part 122 are far away from the image sensing area 113 corresponding to the internal edges of the first dam part 121 to form a 200 μm exclusive region around the peripheries of the image sensing area 113 without the residues P of the first dam 121 as shown in FIG. 2E.

In a preferred first embodiment, the corners of the image sensing window 123 are also defined by the first dam part 121, that is to say, the corners of the image sensing window 123 are formed by the deposition of the first dam part 121. And the second dam part 122 has an exhausting opening 125 aligned to the image sensing window 123 which is greater than the image sensing window 123 so that the image sensing window 123 is a stair-shaped opening inside the exhausting opening 125. In a more specific embodiment, the dam combination 120 is a multi-layer structure with the second dam part 122 stacked on the first dam part 121 where the thickness of the first dam part 121 can be the same or less than the thickness of the second dam part 122 such as not greater than 22 μm. Furthermore, the first dam part 121 covers the electrodes 114.

The transparent lid 130 is disposed on the dam combination 120 to airtight seal the image sensing window 123 where the transparent lid 130 is an optical glass with a preferred dimension not greater than the active surface 111. The external terminals 140 are disposed on the back surface 112 of the image sensor chip 110 and are electrically connected to the electrodes 114 where all of the external terminals 140 are located within the footprint of the image sensor chip 110. The external terminals 140 include a plurality of solder balls. Moreover, image sensor chip 110 further has a plurality of TSVs (Through Silicon Via) 115 to electrically connect the electrodes 114 to the external terminals 140.

Therefore, in the present invention, the chip scale package 100 of image sensor is provided to further shrink the central opening (i.e. the image sensing window 123) of the dam combination 120 to further closer to the image sensing area without photoresist residues of the dam combination and also to provide enough adhesive area to hold the transparent lid 130 on top of the dam combination 120 to achieve microminiaturization of chip scale image sensor packages. Through the dam combination 120 formed by the first dam part 121 and the second dam part 122, dam thickness and dam attached area on the image sensor chip 110 are satisfied for fixing the transparent lid 130. The airtight condition of sealing the image sensing area 113 and the image sensing quality through the image sensing area 113 are more effective when the vertical spacing inside the image sensing window 123 from the transparent lid 130 to the image sensor chip 110 is not less than 40 μm.

Figure 2A:
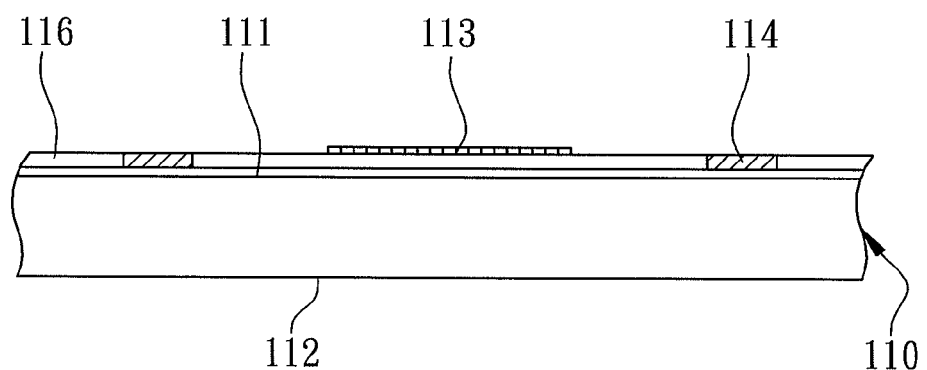
FIGS. 2A to 2E are cross-sectional views illustrating the major components of the chip scale package during packaging processes according to the first embodiment of the present invention.
Figure 2B:
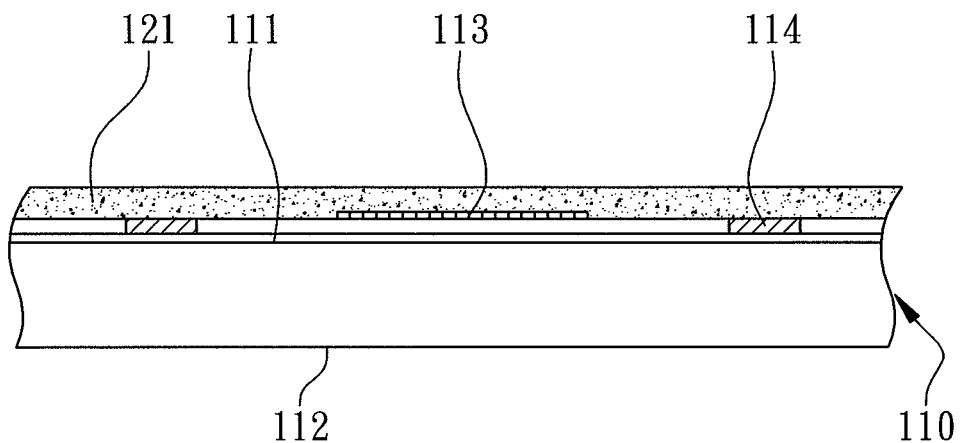
Figure 2C:
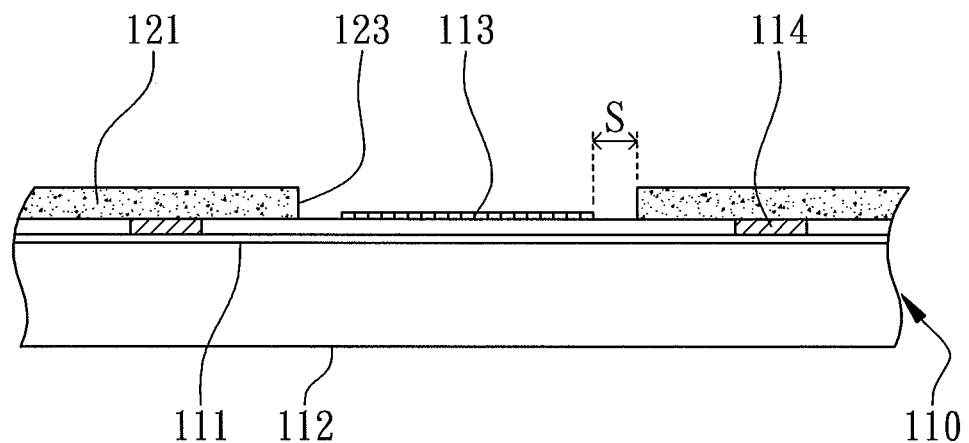
Figure 2D:
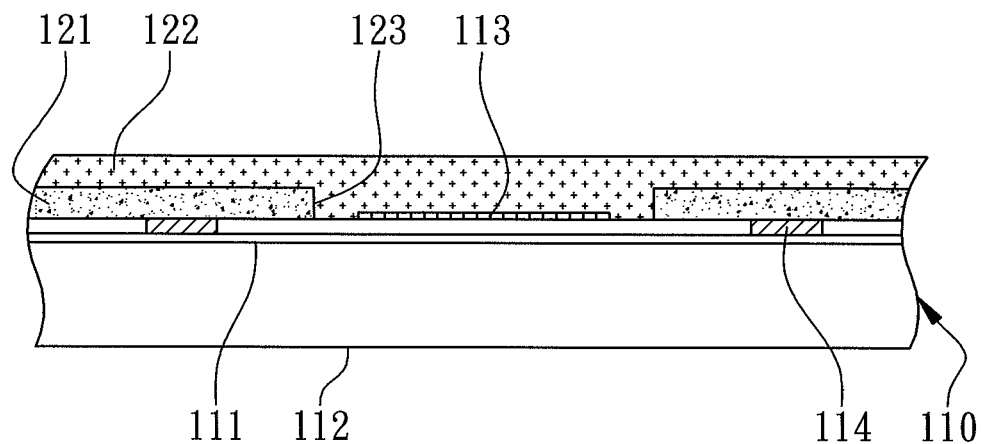
Figure 2E:
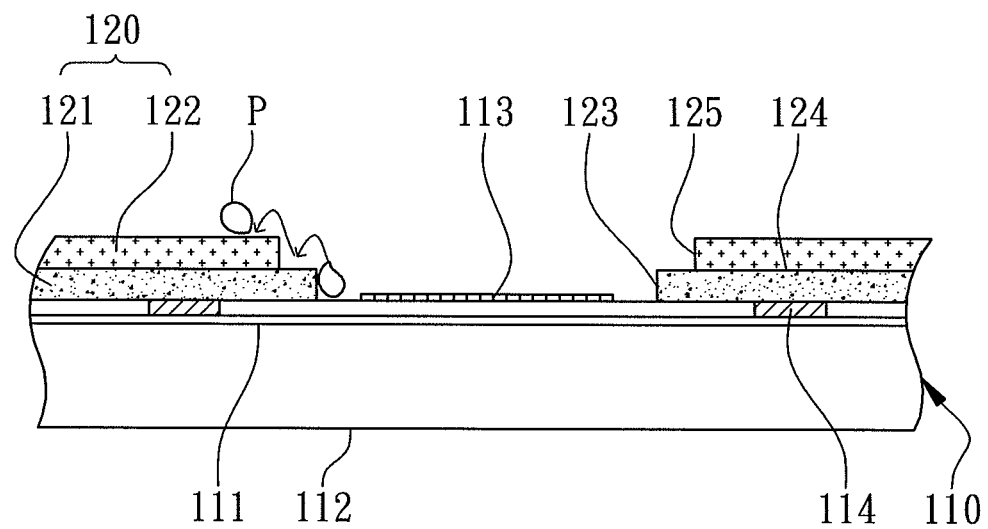

FIGS. 2A to 2E are cross-sectional views illustrating the formation of the dam combination 120 during the packaging processes of the chip scale package 100. As shown in FIG. 2A, an image sensor chip 100 in a wafer form is provided where the image sensor chip 100 having an active surface 111 and an opposing back surface 112 where an image sensing area 113 and a plurality of electrodes 114 are disposed on the active surface 111 whereas a plurality of the image sensor chips 110 are still in a wafer form before singulation. As shown in FIG. 2B, the photo-sensitive precursor of the above-mentioned first dam part 121 is disposed by the first wafer spin-coating processes. In this step, the photo-sensitive precursor of the first dam part 121 completely covers the active surface 111 including the image sensing area 113. As shown in FIG. 2C, the first photolithographic processes are proceeded. Through exposure and development, the above-mentioned photo-sensitive precursor of the first dam part 121 is patterned to form the peripheries of the image sensing window 123 where the image sensing window 123 exposes the image sensing area 113 within and the horizontal spacing S from the peripheries of the image sensing window 123 to the image sensing area 113 is not greater than 200 μm. As shown in FIG. 2D, the photo-sensitive precursor of the above-mentioned second dam part 122 is disposed by the second wafer spin-coating processes to complete cover the first dam part 121 as well as the image sensing area 113. As shown in FIG. 2E, the second photolithographic processes are proceeded. Through exposure and development, the about-mentioned photo-sensitive precursor of the second dam part 122 is patterned to form an exhausting opening 125 which is greater than the image sensing window 113 so that the internal edges of the combination interface 124 formed by the first dam part 121 and the second dam part 122 is shaped as a stair-shaped opening. Therefore, the residues P of the first dam part 121 and the second dam part 122 can be washed away by the developing solution and the cleaning solution which are exhausted through the thin peripheries of the image sensing window 123 formed by the first dam part 121 and the exhausting opening 125 formed by the second dam part 122 without accumulated inside the image sensing window 123 to achieve better sensing quality of the image sensing area 113. Then, a transparent lid 130 is disposed on top of the dam combination 120. The above-mentioned TSV 115 and the external terminals 140 are fabricated by MEOL and BEOL processes, as shown in FIG. 1.

Figure 3:
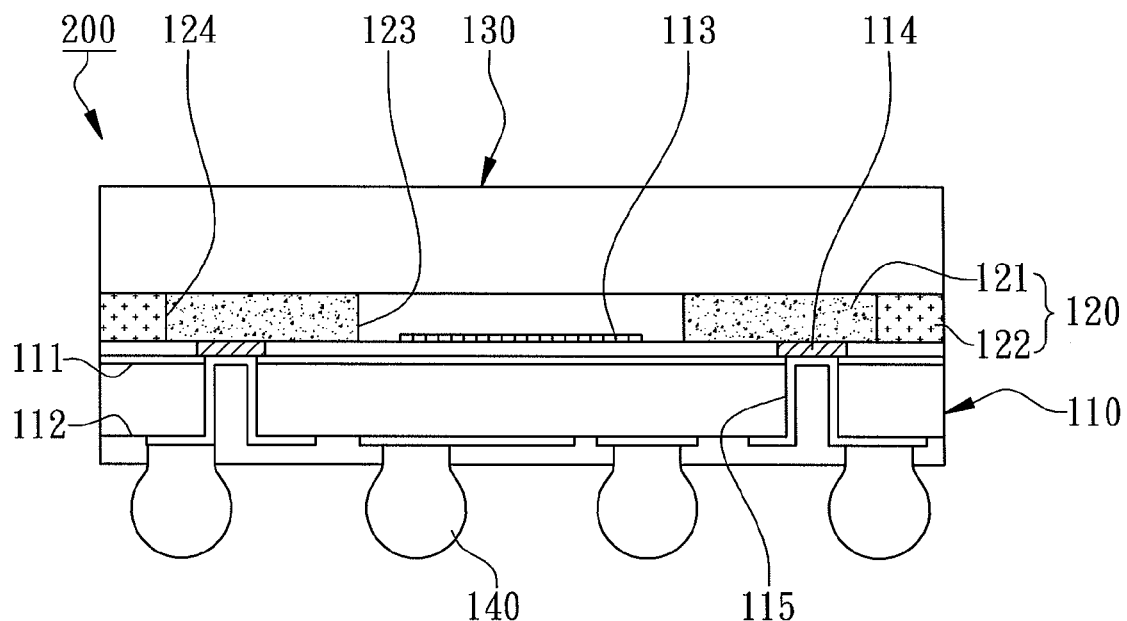
FIG. 3 is a cross-sectional view illustrating another chip scale package of image sensor having dam combination according to the second embodiment of the present invention.
Figure 4:
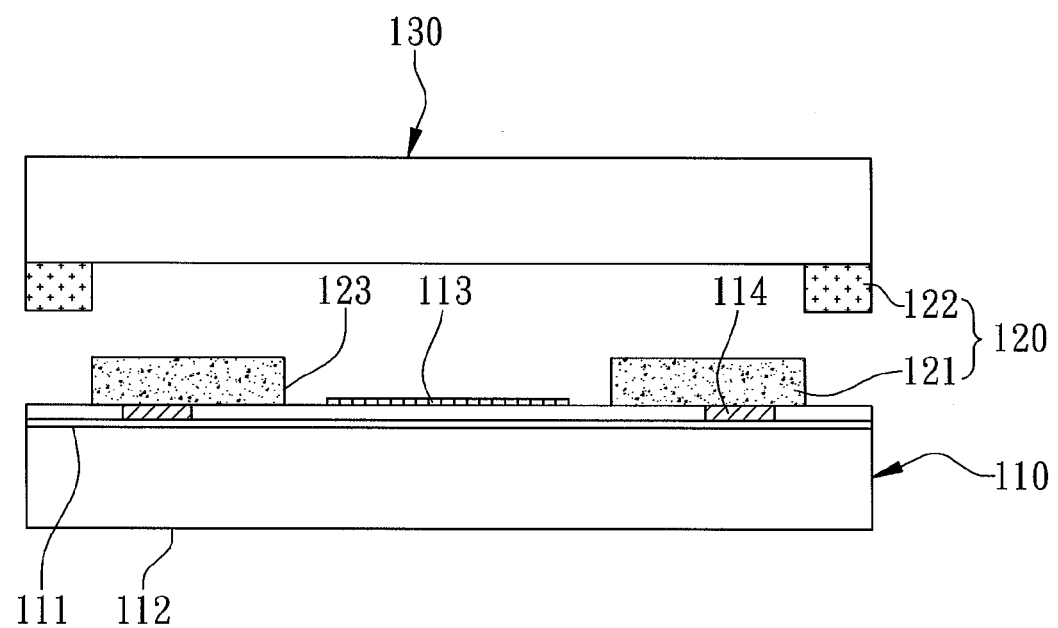
FIG. 4 is a cross-sectional view illustrating the fabrication of the chip scale package during the placement of the transparent lid according to the second embodiment of the present invention.

According to the second embodiment of the present invention, another chip scale package of image sensor having dam combination as illustrated in FIG. 3 where the major components, functions, and numbers are the same as the first embodiment so that there is no further description herein. The chip scale package 200 comprises an image sensor chip 110, an dam combination 120, a transparent lid 130, and a plurality of external terminals 140. A cross-sectional view of the chip scale package 200 during the placement of the transparent lid 130 is illustrated in FIG. 4, a chip top view of the image sensor chip 110 of the chip scale package 200 during the pre-disposition of a first dam part 121 of the dam combination 120 before the placement of the transparent lid 130 is illustrated in FIG. 5, and a bottom view of the transparent lid 130 of the chip scale package 200 during the pre-disposition of a second dam part 122 of the dam combination 120 before the placement of the transparent lid 130 is illustrated in FIG. 6.

The image sensor chip 110 has an active surface 111 and an opposing back surface 112 where an image sensing area 113 and a plurality of electrodes 114 are disposed on the active surface 111. The dam combination 120 consists essentially of a first dam part 121 and a second dam part 122 and has an image sensing window 123 to expose the image sensing area 113 within. The first dam part 121 and the second dam part 122 are disposed on the active surface 111 where the horizontal spacing from the peripheries of the image sensing window 123 formed by the internal edges of the first dam part 121 to the image sensing area 113 is not greater than 200 μm. The first dam part 121 and the second dam part 122 have a combination interface 124 where the combination interface 124 and the second dam part 122 are far from the image sensing area 113 corresponding to the first dam part 121 so that the residues P of the first dam part 121 do not contaminate the 200 μm exclusive region around the image sensing area 113 as shown in FIG. 5. The transparent lid 130 is disposed on the dam combination 120 to airtight seal the image sensing area 113 in the image sensing window 123. The external terminals 140 are disposed on the back surface 112 of the image sensor chip 110 and are electrically connected to the electrodes 114 where all of the external terminals 140 are located within the footprint of the image sensor chip 110 to meet the requirements of the chip scale image sensor packages without increase the dimension of the image sensor chip 110.

Figure 5:
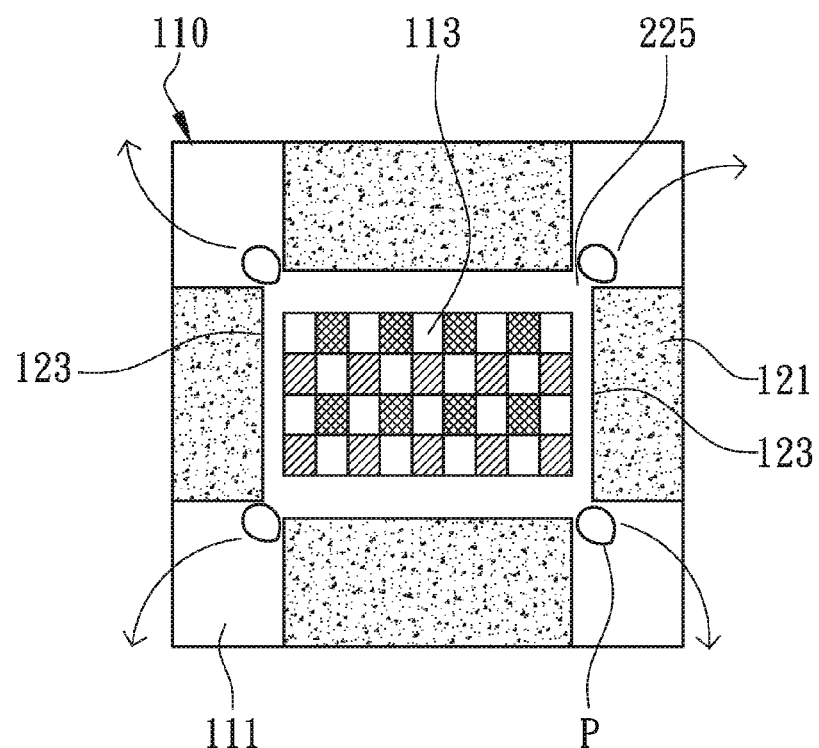
FIG. 5 is a chip top view illustrating the pre-disposition of first dam part before the placement of the transparent lid during the fabrication of the chip scale package according to the second embodiment of the present invention.
Figure 6:
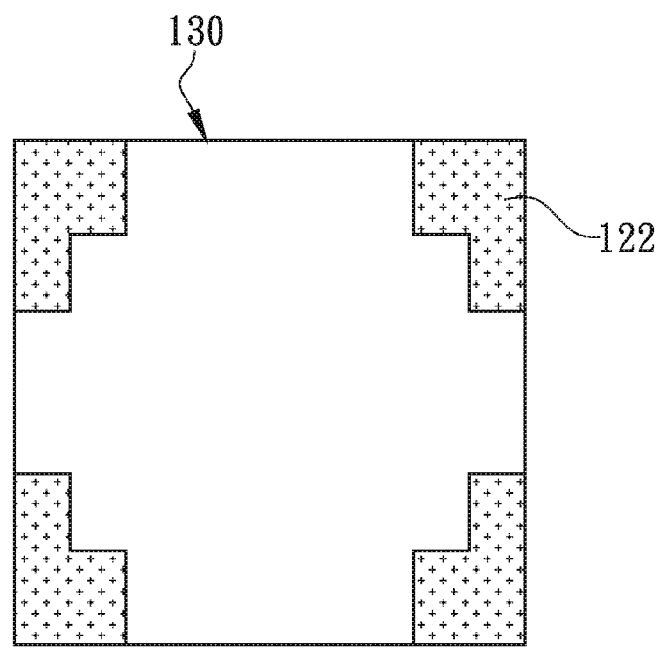
FIG. 6 is a bottom view of the transparent lid illustrating the pre-disposition of second dam part before the placement of the transparent lid during the fabrication of the chip scale package according to the second embodiment of the present invention.

In the second embodiment, the corners of the image sensing window 123 is defined by the second dam part 122 so that the first dam part 121 has a plurality of corner exhausting openings 225 at the corners of the image sensing window 123 to easily exhaust the residues P of the first dam part 121 from the image sensing window 123 as shown in FIG. 5. In a more specific embodiment, the dam combination 120 can be a single layer with compensated patterns where the first dam part 121 and the second dam part 122 form a compensated rectangular ring. The shape of the first dam part 121 can be independent strips and is pre-formed on the active surface 111 of the image sensor chip 110 as shown in FIG. 5. The shape of the second dam part 122 can be L-shape or triangles or rectangles and is pre-formed on the transparent lid 130 as shown in FIG. 6 and then the transparent lid 130 is pressed against the first dam part 121 on the active surface 111 of the image sensor chip 110 where the first dam part 121 and the second dam part 122 have compensated patterns to airtight seal the image sensing window 123. Moreover, the first dam part 121 covers the electrodes 114.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A chip scale package of an image sensor comprising:
    an image sensor chip having an active surface and an opposing back surface, wherein the active surface includes an image sensing area, and a plurality of electrodes are disposed on the active surface;
    a dam combination consisting essentially of a first dam part and a second dam part and having an image sensing window to expose the image sensing area within, wherein the first dam part and the second dam part are disposed on the active surface so that a plurality of peripheries of the image sensing window are defined by a plurality of internal edges of the first dam part, a horizontal spacing from a plurality of peripheries of the image sensing window to the image sensing area is not greater than 200 pm, wherein there is a combination interface between the first dam part and the second dam part since the first dam part has a forming priority on the image sensor chip comparing to the second dam part, wherein the combination interface and the second dam part are farther away from the image sensing area comparing to a distance from the internal edges of the first dam part to the image sensing area so that any residue formed by the first dam part does not remain in a 200 μm exclusive region surrounding the image sensing area;
    a transparent lid disposed on the dam combination to airtight seal the image sensing window; and
    a plurality of external terminals disposed on the back surface of the image sensor chip and electrically connected to the electrodes, wherein all of the external terminals are located within the footprint of the image sensor chip;
    wherein the first dam part covers the electrodes, wherein the image sensor chip further has a plurality of TSVs electrically connecting the electrodes to the external terminals, and
    wherein the first dam part and the second dam part are photo-sensitive polymers.

2. The chip scale package as claimed in claim 1, wherein a plurality of corners of the image sensing window are also defined by the first dam part, wherein the second dam part has an exhausting opening aligned to the image sensing window, wherein the exhausting opening is larger than the image sensing window to shape the image sensing window as a stair-shaped opening inside the exhausting opening.

3. The chip scale package as claimed in claim 2, wherein the dam combination is a multi-layer structure, wherein the second dam part is disposed on the first dam part.

4. The chip scale package as claimed in claim 1, wherein the first dam part has a plurality of corner exhausting openings adjacent to a plurality of corners of the image sensing window for depositing the second dam part in a manner that the corners of the image sensing window are formed by the second dam part.

5. The chip scale package as claimed in claim 4, wherein the dam combination is a single layer structure with compensated patterns of the first dam part and the second dam part to form a rectangular ring.

6. The chip scale package as claimed in claim 1, wherein the transparent lid is an optical glass having a covering area not greater than the active surface.

7. The chip scale package as claimed in claim 1, wherein the external terminals include a plurality of solder balls.

8. The chip scale package as claimed in claim 1, wherein a vertical spacing inside the image sensing window from the transparent lid to the image sensor chip is not less than 40 μm through the combination of the first dam part and the second dam part.

* * * * *